United States Patent
Glass et al.

(10) Patent No.: US 7,345,545 B2
(45) Date of Patent: Mar. 18, 2008

(54) ENHANCEMENT MODE TRANSCEIVER AND SWITCHED GAIN AMPLIFIER INTEGRATED CIRCUIT

(75) Inventors: Elizabeth C. Glass, Gilbert, AZ (US); Olin L. Hartin, Chandler, AZ (US); Ngai Ming Lau, Fountain Hills, AZ (US); Neil T. Tracht, Mesa, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 514 days.

(21) Appl. No.: 11/092,070

(22) Filed: Mar. 28, 2005

(65) Prior Publication Data

US 2006/0217078 A1  Sep. 28, 2006

(51) Int. Cl.
*H03F 3/16* (2006.01)

(52) U.S. Cl. .............. 330/277; 330/250; 330/251; 330/252; 330/253; 455/78; 455/333

(58) Field of Classification Search .......... 455/78, 455/333; 330/250, 251, 252, 253, 277
See application file for complete search history.

(56) References Cited

U.S. PATENT DOCUMENTS

| 5,693,544 | A | * | 12/1997 | Abrokwah et al. ......... 438/285 |
| 5,777,530 | A | * | 7/1998 | Nakatuka ................ 333/104 |
| 5,832,370 | A |   | 11/1998 | Pena-Finol et al. |
| 5,895,929 | A | * | 4/1999 | Abrokwah et al. ........... 257/20 |
| 6,211,729 | B1 | * | 4/2001 | Morkner et al. ............. 330/51 |
| 6,429,103 | B1 | * | 8/2002 | Johnson et al. ............. 438/518 |
| 6,504,433 | B1 |   | 1/2003 | Weber et al. |
| 6,642,578 | B1 | * | 11/2003 | Arnold et al. .............. 257/341 |
| 6,730,953 | B2 | * | 5/2004 | Brindle et al. ............. 257/296 |
| 6,803,680 | B2 | * | 10/2004 | Brindle et al. ............. 307/115 |
| 6,821,829 | B1 |   | 11/2004 | Peatman et al. |
| 2004/0141470 | A1 |   | 7/2004 | Kelcourse et al. |
| 2006/0214238 | A1 | * | 9/2006 | Glass et al. ................ 257/401 |
| 2006/0217078 | A1 | * | 9/2006 | Glass et al. .................. 455/78 |

* cited by examiner

*Primary Examiner*—Lana Le
*Assistant Examiner*—April Guzman
(74) *Attorney, Agent, or Firm*—Ingrassia, Fisher & Lorenz, P.C.

(57) ABSTRACT

Methods and apparatus are provided for RF switches (504, 612) integrated in a monolithic RF transceiver IC (500) and switched gain amplifier (600). Multi-gate n-channel enhancement mode FETs (50, 112, 114, Q1-3, Q4-6) are used with single gate FETs (150), resistors (Rb, Rg, Re, R1-R17) and capacitors (C1-C3) formed by the same manufacturing process. The multiple gates (68) of the FETs (50, 112, 114, Q1-3, Q4-6) are parallel coupled, spaced-apart and serially arranged between source (72) and drain (76). When used in pairs (112, 114) to form a switch (504) for a transceiver (500) each FET has its source (74) coupled to an antenna RF I/O port (116, 501) and drains coupled respectively to second and third RF I/O ports (118, 120; 507, 521) leading to the receiver side (530) or transmitter side (532) of the transceiver (500). The gates (136, 138) are coupled to control ports (122, 124; 503, 505; 606, 608). When used in pairs (Q1-3, Q4-6) to form a variable switched attenuator, the first FET (Q1-3) is a pass device and the second FET (Q4-6) is a shunt device that respectively bridge two series resistors (R1, R2) and block a shunt resistor (R3) of a T-type attenuator.

18 Claims, 9 Drawing Sheets

ENHANCEMENT MODE TRANSCEIVER AND SWITCHED GAIN AMPLIFIER INTEGRATED CIRCUIT

TECHNICAL FIELD

The present invention generally relates to radio-frequency (RF) integrated circuits (ICs) and more particularly relates to RF ICs employing enhancement mode field-effect transistors.

BACKGROUND

Figure 1:
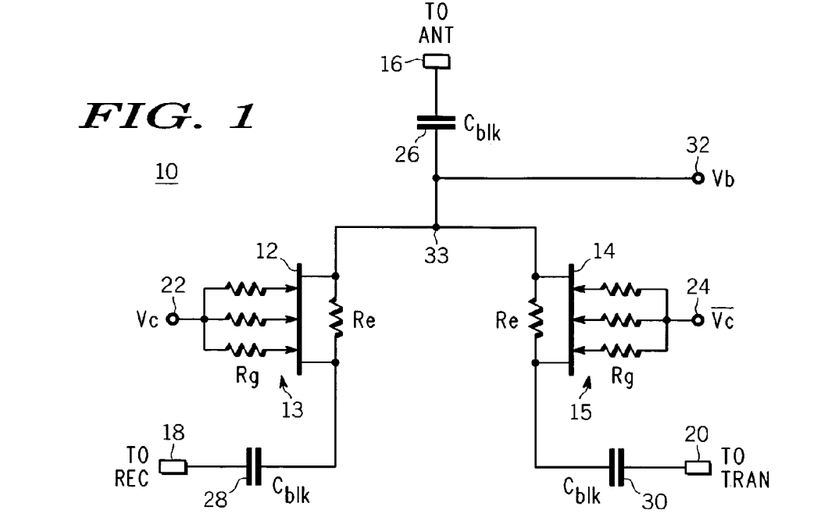
FIG. 1 is a simplified schematic circuit diagram of an RF transmit-receive switch according to the prior art, employing n-channel depletion mode FETs.

Field effect transistors (FETs) are widely used in many RF applications because of their comparatively high OFF impedance, comparatively low ON impedance, low leakage and relatively low drive voltages. In order to meet the voltage, linearity, power handling, breakdown and leakage requirements of, for example, mobile communication systems, multi-gate FET structures and circuits have been developed. FIG. 1 illustrates prior art multi-gate transmit-receive RF switch 10 employing n-channel depletion mode FETs 12, 14 coupled respectively between antenna port 16 and receiver port 18 and transmitter port 20. Resistances Re shunt the source-drain regions of transistors 12, 14. Resistances Rg are in series with the gate leads 13, 15 of transistors 12, 14. Control voltages Vc and Vc(bar) are provided respectively at ports or connections 22, 24. Depletion mode devices 12, 14 are ON at Vgs=0 and OFF when Vgs exceeds the device threshold voltage. DC blocking capacitances ($C_{blk}$) 26, 28, 30 are provided so that the source and drain regions of transistors 12, 14 can float with respect to control voltages Vc, Vc(bar). This permits circuit 10 to operate from a single positive supply of, for example, Vc=+3 volts and Vc(bar)=0 volts (and vice versa). Because of the leakage through the transistors, node 33 will tend to drift to the highest DC operating potential. Then, for example, when Vc=+3 volts and Vc(bar)=0 volts, transistor 12 will usually be ON and transistor 14 will be OFF. When the polarity is reversed (i.e., Vc=0 volts and Vc(bar)=+3 volts), then transistor 12 is usually OFF and transistor 14 is ON. However, it is also common to have additional control pin or connection 32 coupled to node 33 in order to supply the desired operating bias to circuit 10. A significant limitation of these depletion mode devices and this prior art circuit and biasing arrangement is that they not suitable for use with enhancement mode n-channel devices needed to form other elements in a fully integrated RF transceiver IC, for example, other elements such as amplifiers, switched gain amplifiers and other functions along with one or more RF switches. Accordingly there continues to be a need for improved RF FETs and circuits, especially for multi-gate enhancement mode RF switches suitable for integration with various other circuit elements needed in monolithic RF integrated circuits (ICs) for mobile communications.

Accordingly, it is desirable to provide an improved RF switching device and method. It is further desirable that the RF switching device be an enhancement mode FET RF device, and that it be adaptable for multi-port applications, especially in transmit-receive and other switching applications and for use in forming fully integrated RF ICs employing a common technology. Still further, it is desirable that the FET RF switch be capable of operating from a single positive supply and/or switching voltage and biased to an appropriate operating point without the need for other reference voltages and/or additional control pins. In addition, it is desirable that process technology employed for forming the RF switch be compatible with other communication circuit elements desired to be incorporated in monolithic integrated circuits (ICs) for communication applications. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 2:
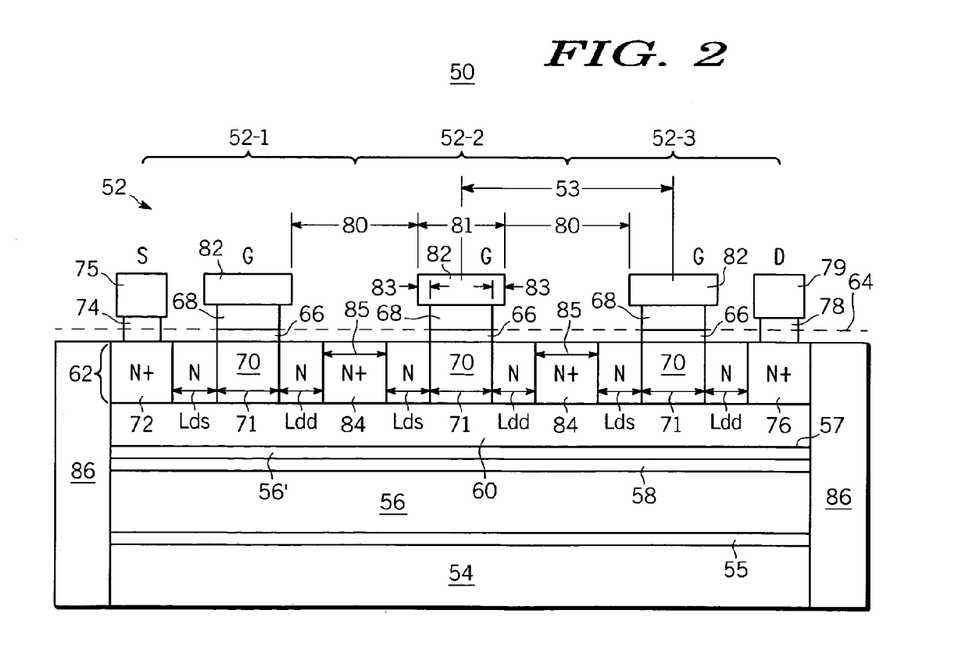
FIG. 2 is a simplified schematic cross-sectional view through a multi-gate, n-channel, enhancement mode FET according to the present invention.

FIG. 2 is a simplified schematic cross-sectional view through multi-gate, n-channel, enhancement mode FET 50 according to the present invention. FET 50 is a multigate n-channel enhancement mode hetero-structure insulated gate field effect transistor (E-HIGFET). FET 50 is formed on substrate 54, typically of GaAs single crystal. Optional buffer layer 55 overlying substrate 54 is useful in reducing device leakage but is not essential. Buffer layer 55 can be comprised of a single layer or a plurality of layers and can have a thickness of approximately one hundred to three hundred nanometers. Buffer layer 55 can be comprised of gallium arsenide and/or aluminum gallium arsenide. In the preferred embodiment, buffer layer 55 consists of substantially undoped gallium arsenide and is located on substrate 54. As used herein, the term "undoped" is defined as a doping level of less than approximately 1E12 atoms per centimeter squared. Layer 55 is preferably an epitaxially layer. Commonly assigned U.S. Pat. Nos. 6,429,103, 5,895,929 and 6,821,829 provide information on buffer structures and materials. GaAs layer 56, 56' is provided on substrate 54 or buffer layer 55, e.g., by epitaxial growth. In an exemplary embodiment, layer 56, 56' is of the order of about 2000 Angstroms (Å) in thickness. Narrow region 58 is formed within GaAs layer 56 near its upper surface 57 to adjust the threshold voltage of FET 50. As an example, region 58 can be formed by silicon delta doping to a concentration of approximately 1E11 to 5E12 atoms percentimeter squared. Portion 56' of layer 56 of, for example, about 30 Å thickness, lies above region 58. Layer 60 of, desirably, InGaAs with an indium concentration usefully in the range of 10 to 35 mole percent, preferably 15 to 24 mole percent, is formed above GaAs layer 56. In an exemplary embodiment, layer 60 is about 150 Å thick but thinner or thicker layers can also be used. Substantially insulating AlGaAs layer 62 is then formed above layer 60 with, for example, a thickness of about 250 Å and an aluminum concentration usefully in the range of about 45 to 90 mole percent, preferably about 65 to 85 mole percent. Layers 60, 62 are conveniently formed by epitaxial growth using methods well known in the art. Substantially intrinsic GaAs layer 64 having a thickness of on the order of 6 nm to 9 nm, is then formed above layer 62. Gate regions 68, desirably of a refractory highly conductive metal or semimetal are formed on portions 66 of upper GaAs layer 64. TiWN is preferred but not essential for regions 68. Most of layer 64 except portions 66 under gate regions 68 is subsequently removed, leaving GaAs layer portions 66 beneath each gate region 68. Portions 66 and gate regions 68 have, for example, length 71 of about ≦0.85 microns, but larger or smaller dimensions may also be used. Gate regions 68 and underlying portions 66 are used as a mask allowing light N doping of AlGaAs layer 62 on either side of gate regions 68. This provides lightly doped N type regions labeled Lds and Ldd in layer 62 on either side of gate regions 68. Initially the lightly doped N region extends everywhere in layer 62 except for channel regions 70 of length 71 beneath portions 66 and gate regions 68, which channel regions 70 remain as substantially undoped insulating AlGaAs. Subsequently, layer 62 outside of channel regions 70 is further N doped to provide $N^+$ or $N^{++}$ doped source region 72, drain region 76 and intermediate regions 84. Metal conductors 82 (e.g., "metal-1") of width 81 are provided over gate regions 68 to reduce the gate series resistance. Metal conductors 82 overhang gate regions 68 by amounts 83 and are separated from each other by distance or separation 80. Metal conductors 82 are conveniently of gold, but other highly conductive materials may also be used. Gate-to-gate pitch 53 and separation 80 between adjacent gate metal conductors 82 of individual devices 52-1, 52-2, 52-3, etc., influence the source-drain breakdown voltage and the source-drain ON-state resistance of FET 50. The larger pitch 53 and separation 80, the larger the breakdown voltage and On-state resistance. $N^+$ or $N^{++}$ regions 84 of length 85 are introduced into layer 62 between adjacent devices 52 of multi-gate FET 50 to reduce the series ON-state resistance of multi-gate FET 50. Lightly doped regions Lds and Ldd on either side of portions 66, gate regions 68 and channel regions 70 allow the breakdown voltage of FET 50 to be set to a predetermined value. Making Lds and Ldd larger, increases the device breakdown voltage but can also increase the ON-state resistance. This is avoided or mitigated by providing $N^+$ or $N^{++}$ regions 84 of length 85 between multi-gate devices 52. This substantially reduces the ON-state resistance of FET 50 without significant adverse effect on the breakdown voltage of the device. Ldd (and Lds) contribute to ON-state resistance (Ron) consistent with their sheet resistance, which is usefully about 1100 ohms/square. About 1.1 ohms are contributed by every additional one-micron length of Ldd regions (or Lds regions). With Ldd (or Lds) regions of ~0.3 microns length, about 10 volts is contributed to the breakdown voltage for every additional one-micron in length of Ldd (or Lds). An increase in the length of Ldd and Lds regions to maintain symmetry, from 0.3 microns to 0.4 microns, would increase Ron by about 0.22 ohms, and breakdown voltage by nominally about 1 volt, gate to source and gate to drain.

Substantially insulating lateral isolation walls 86 are desirably but not essentially formed surrounding multi-gate FET 50. In an exemplary embodiment, isolation walls 86 are formed by oxygen implantation into and through the various layers described above down to and into substrate 54. However, other means well known in the art may also be used to form lateral isolation walls 86. In the discussion above, various thicknesses, dimensions and doping levels are indicated, but these are merely by way of exemplary embodiments and not intended to be limiting. Persons of skill in the art will understand based on the description herein that larger and smaller dimensions may be used and larger and smaller doping levels may be used and fewer or more gates may be cascaded, depending upon the target specifications of the particular multi-gate device they desire to form. Thus, the numerical examples provided herein are for purposes of illustration and not limitation.

While FIG. 2 illustrates multi-gate FET 50 with three series connected devices 52, that is with devices 52-1, 52-2, 52-3, persons of skill in the art will understand based on the description herein that FET 50 can have any number of parallel-coupled but serially arranged gates greater than or equal to one. N+ source region 72 with source contact 74 and source metal conductor 75 is provided at one end of multi-gate FET 50 comprising serially arranged devices 52-1, 52-2, . . . 52-G, and N+ drain region 76 with drain contact 78 and drain metal conductor 79 is provided at the other end of multi-gate FET 50. Stated another way, source region 72 with source contact 74 and source conductor 75 is provided on device 52-1 and drain region 76 with drain contact 78 and drain conductor 79 is provided on device 52-G (in FIG. 2, G=3). Intermediate $N^+$ or $N^{++}$ regions 84 serve as the source and drain of the devices on either side of intermediate $N^+$ or $N^{++}$ regions 84. No separate contacts need be provided to such intermediate regions, but that is not precluded. It will be noted that devices 52 are symmetrical. It does not matter which of regions 72, 76 with contacts 74, 78 and conductors 75, 79 is used as the source and which is used as the drain. Accordingly, the words (and abbreviations) "source" (S) and "drain" (D) in connection with FIG. 2 and elsewhere herein are merely for convenience of explanation and not intended to be limiting.

Contacts 74, 78 are conveniently of NiGeAu (but other Ohmic contact materials can also be used) and conductors 75, 79 (e.g., "metal-2") are conveniently of gold but other highly conductive materials may also be used. The designations "metal-1" and "metal-2" are used to indicate the preferred order in which these conductors are applied, but this is not essential. In the preferred embodiment, metal-2 for contacting and interconnecting the source-drain regions is generally thicker than metal-1 for contacting and interconnecting the gate regions. The same diffusion or implant steps for providing N+ regions 72, 76 is also conveniently used to form resistances, such as are employed for example in the circuit of FIG. 3. Capacitances are conveniently formed by providing a metal-insulator-metal (MIM) sandwich comprising, for example, metal-1, an insulating silicon nitride layer and metal-2, but other metals and dielectrics may also be used. Metal-1 and metal-2 and silicon nitride layers are conveniently formed by means well known in the art. While the HIGFET structure illustrated in FIG. 2 is preferred, other types of enhancement mode FET structures can also be used. Further details on the various layers used in the fabrication of FET devices such as are described here can be found in commonly assigned U.S. Pat. Nos. 5,693,544 and 6,821,829. The fabrication steps described therein are illustrative of steps that may be used by persons of skill in the art to fabricate FET 50 of the present invention based on the description herein and are not intended to be limiting.

Figure 3:
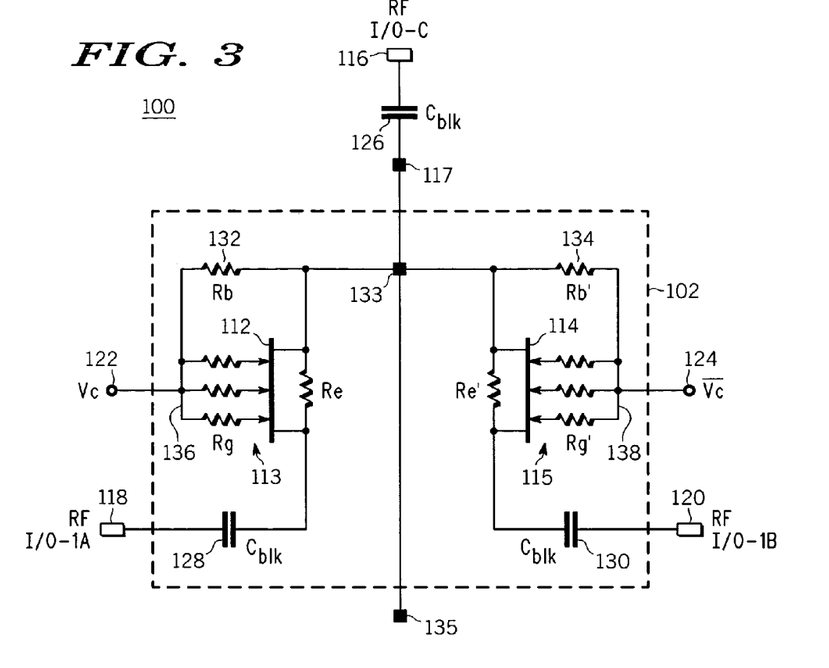
FIG. 3 is a simplified schematic circuit diagram of an RF transmit-receive switch employing the n-channel enhancement mode FETs of FIG. 2 and illustrating the means and method for biasing, according to the present invention.

FIG. 3 is a simplified schematic circuit diagram of RF switch 100 according to an exemplary embodiment of the present invention, employing n-channel enhancement mode FETs 112, 114, and further illustrating how switch 100 is conveniently biased. FETs 112, 114 are preferably like or analogous to FET 50 of FIG. 2, with the same or more or fewer gates. FETs 112, 114 are coupled respectively between RF I/O-C port 116 (e.g., an antenna port) and RF I/O-1A port 118 (e.g., a receiver port) and RF I/O-1B port 120 (e.g., a transmitter port). Resistances Re, Re' shunt the source-drain regions of FETs 112, 114. Resistances Rg, Rg' are series resistances (e.g., formed from further N+ regions) added in series with gate leads or conductors 113, 115 of FETs 112, 114 and are much larger than the intrinsic resistance of the gates and gate conductors. Gate resistances Rg, Rg' conveniently (but not essentially) have substantially the same value and in subsequent discussions the convention is followed of referring to them collectively as Rg, but this is merely for convenience of explanation and not intended to be limiting. Shunt resistances Re, Re' conveniently (but not essentially) have substantially the same value and in subsequent discussions the convention is followed of referring to them collectively as Re, but this is merely for convenience of explanation and not intended to be limiting. Re is on the order of the value of the series resistance Rg. Re and Rg are conveniently additional discrete N+ implanted resistances, but other resistance structures may also be used. The arrowheads on gate leads 113, 115 denotes Schottky gate FETs, but other types of FETs may also be used.

Control voltages Vc and Vc(bar) are provided, respectively, at control ports or connections 122, 124. Enhancement mode devices or FETs 112, 114 are OFF at Vgs=0 and ON when Vgs exceeds the device threshold voltage Vth. DC blocking capacitors or capacitances ($C_{blk}$) 126, 128, 130 are provided so that the DC potential of source and drain regions of FETs 112, 114 can be set with respect to control voltages Vc, Vc(bar) by resistances 132, 134 identified as Rb, Rb' respectively. Bias resistances Rb, Rb' conveniently (but not essentially) have substantially the same value and in subsequent discussions the convention is followed of referring to them collectively as Rb, but this is merely for convenience of explanation and not intended to be limiting. Bias resistances Rb 132, 134 are coupled between control ports 122, 124 and common node 133. Resistances Rb 132, 134 form a potential divider that sets the potential of node 133 between Vc and Vc(bar). This permits enhancement mode switch 100 to operate from a single positive supply of, for example, Vc=+3 volts and Vc(bar)=0 volts (and vice versa). For example, when Vc=+3 volts and Vc(bar)=0 volts and resistances Rb 132, 134 are substantially equal, FET 112 will have gate-source voltage $(Vgs)_{112}=Vc-V_{133}$ where $V_{133}$ is the potential of node 133, and will turn ON, and FET 114 will have gate-source voltage $(Vgs)_{114}=Vc(bar)-V_{133}$ and will be OFF. When the polarity is reversed (i.e., Vc=0 volts and Vc(bar)=+3 volts), then FET 112 is OFF and FET 114 is ON. The voltage at node 133 with Rb=Rg is $V_{133}\sim 2Vc/3$, which will allow the switch to turn ON and OFF properly. Unlike prior art circuit 10 of FIG. 1, no external pin is needed to set the proper bias voltage. This is a significant advantage of the present invention, since minimization of external connections is much desired.

Expressed more generally, the gate-source voltage Vgs appearing across FETs 112, 114 is determined by voltage $V_{133}$ appearing at node 133 and the control voltage Vc appearing at control ports 122, 124. $V_{133}$ is conveniently expressed as a fraction of the control voltage Vc, that is $V_{133}=k*Vc$, where $k \leq 1$ is given by the following relation:

$$V_{133}/Vc=k=[Rb/(N-1)]/[(Rb/(N-1))+(Rb*Rg/(Rb+Rg))], \quad [1]$$

where N is the number of branches with FETs 112, 114 in switch 100 or, alternatively stated, one less than the total number of RF I/O ports, since one I/O port is common to both transistors. This may be simplified as:

$$V_{133}/Vc=k=[Rb+Rg]/[Rb+NRg], \quad [2]$$

Figure 5:
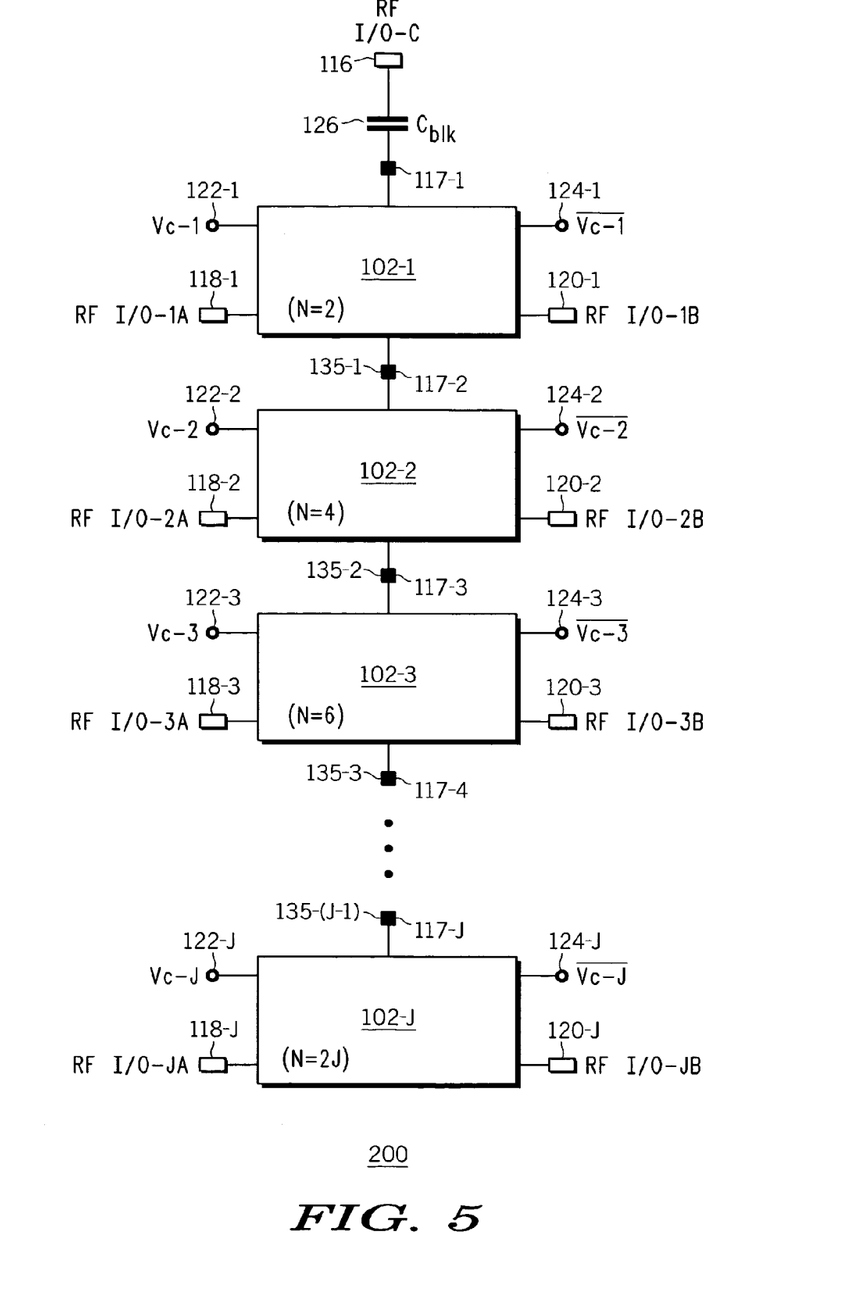
FIG. 5 is a simplified schematic block diagram of a multiport RF switch according to the present invention.

For switch 100 of FIG. 3, N=2, however N may have larger values (e.g., see FIG. 5), that is, N=2, 3, 4 . . . M, where M is any whole integer, even or odd. In an exemplary embodiment, Rg should be large enough (e.g., of the order of several thousand Ohms) to limit the gate current during breakdown and to RF decouple the gates from the control voltage supply. Also, Rb should be much greater than the RF impedance seen at port 116. The RF impedance seen at port 116 is often of the order of fifty Ohms, so Rb is desirably at least one order of magnitude larger than 50 Ohms. Stated another way, the ratio Rb/Rg is desirably on the order of $0.1 \leq (Rb/Rg) \leq 10$, more conveniently $0.25 \leq (Rb/Rg) \leq 5$ and preferably about $0.5 \leq (Rb/Rg) \leq 2$, with Rb desirably in the range of about 100 Ohms$\leq$Rb$\leq$20 k Ohms, more conveniently about $500 \leq Rb \leq 15$ k Ohms and preferably about 1 k$\leq$Rb$\leq$10 k Ohms. Suppose by way of example, that Rb/Rg~1, then the equation [2] can be further simplified as:

$$V_{133}/Vc=k=[Rb+Rg]/[(Rb+NRg]=2/(1+N), \quad [3]$$

so that for N=2, k=0.667; for N=3, k=0.5; for N=4, k=0.4 and so forth. Further suppose that Rb/Rg~2, then equation [2] can be simplified as:

$$V_{133}/Vc=k=[Rb+Rg]/[(Rb+NRg]=3/(2+N), \quad [4]$$

so that for N=2, k=0.75; for N=3, k=0.6; for N=4, k=0.5 and so forth. It will be apparent based on the description herein that the values of k may be adjusted depending upon the number of switch branches so that the switches are appropriately biased. The number of switch branches is generally the same as the number of multi-gate FET devices, e.g., shown in switch 100 (FIG. 2) or switch 200 (FIG. 5). It is generally convenient that k be in the range $0.1 \leq k \leq 1.0$, more conveniently in the range $0.3 \leq k \leq 1.0$ and preferably in the range $0.5 \leq k \leq 0.7$. Re is desirably placed from drain to source to equalize the voltages on the drain and source nodes under RF operation for both ON and OFF states. The value of Re is desirably selected to be much much greater than that of the channel resistance of the FET in the ON-state so that it doesn't create a significant parallel path for current conduction. The value of Re is conveniently in the 10's of kilo-Ohm range. It is generally independent of N, Rb and Re. While it is convenient that Re~Re', Rg~Rg' and Rb~Rb' this is not essential, and different values can be used with individual FETs 112, 114 provided that the appropriate bias voltage is maintained at node 133 for enhancement mode operation.

Figure 4:
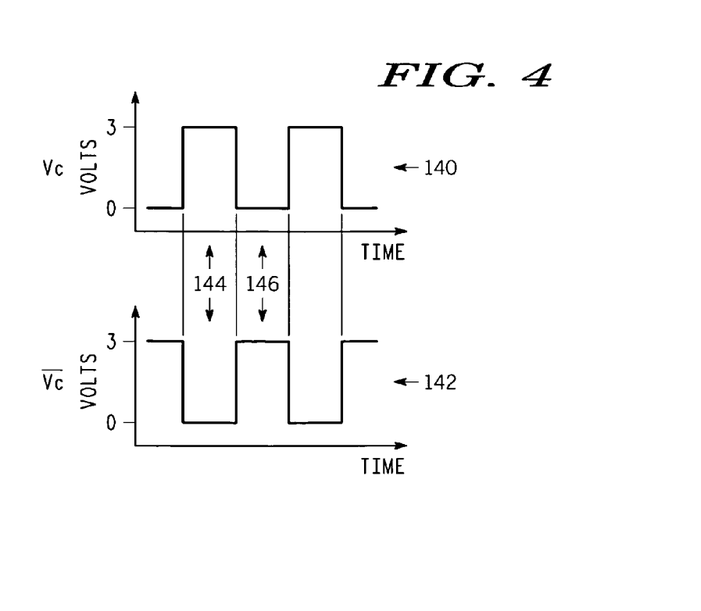
FIG. 4 is a simplified plot of the control voltage applied to the RF switch of FIG. 3, as a function of time.

FIG. 4 shows simplified plots 140, 142 of the control voltage Vc and Vc(bar) applied to RF switch 100 of FIG. 3, as a function of time, assuming that Vc and Vc(bar) range from 0 to +3 volts and vice-versa. As shown in plots 140, 142, during phase 144, Vc=+3 volts and Vc(bar)=0 volts, and during phase 146, Vc=0 volts and Vc(bar)=+3 volts. During phase 144, I/O port 116 (see FIG. 3) is coupled to I/O port 118 while I/O port 120 is blocked, and during phase 146, I/O port 116 is coupled to I/O port 120 while I/O port 118 is blocked. Thus, switch 100 functions as an efficient RF switch in response to control signals provided at control ports 122, 124. The values of Vc, Vc(bar) of +3 and 0 volts are merely exemplary and not intended to be limiting and persons of skill in the art will understand that other values can also be used.

FIG. 5 is a simplified schematic block diagram of multi-port RF switch 200 according to the present invention. Multi-port switch 200 comprises in this illustrative example, J parallel coupled enhancement mode N-channel switches 102 of the type illustrated in FIG. 3, identified successively as 102-1, 102-2, 102-3, . . . , 102-J, Nodes 117-1 through 117-J are analogous to node 117 of FIG. 3 and nodes 117-1 through 117-J are commonly coupled to blocking capacitance 126 and I/O port 116 via nodes 135-1 through 135-(J-1). Node 117-1 of first switch 102-1 is coupled to RF I/O-C port 116, e.g., the antenna port. Node 117-2 of second switch 102-2 is coupled to node 135-1 of first switch 102-1 and, since nodes 117 and 135 in each switch 102 are coupled together, they are therefore also coupled to RF I/O-C port 116. This is repeated for each successive switch 102-3, 102-3 . . . 102-J. Thus, all J RF switches are coupled in parallel to RF-I/O-C port 116. This arrangement is especially useful when a signal to or from RF I/O-C port 116 is desired to be coupled to one or the other of several receiver/transmitter combinations (or other functions), which are in communication for example with RF I/O ports 118-1 and 120-1; 118-2 and 120-2; 118-3 and 120-3; . . . 118-J and 120/J.

Suppose, for example, that multi-port switch 200 is being used to switch among one or the other of several signaling protocols, e.g., GSM, CDMA, TDMA, FDMA, etc. The GSM transmitter and receiver can be connected to ports 118-1, 120-1 respectively, the CDMA transmitter and receiver to ports 118-2, 120-2 respectively, the TDMA transmitter and receiver to ports 118-3, 120-3 respectively and so forth. Control voltages Vc-1, Vc(bar)-1; Vc-2, Vc(bar)-2; Vc-3, Vc(bar)-3 . . . Vc-J, Vc(bar)-J are used to control which switch is activated thereby coupling RF I/O-C port 116 to the desired transmitter or receiver. Equations [1]-[2] can be used to determine the appropriate values of Rb and Rg so that switches 102 operate properly. In the example of FIG. 5, N=2J, and J is the number of parallel three-port switches 102-1 . . . 102-J. FIG. 5 illustrates the situation where each switch 102-i is a three-port switch, that is, with nodes 117-i and I/O ports 118-i, and 120-i, but this is not essential and any or all of switches 102-i can have fewer ports. Thus, N need not be an even number. For example, suppose switch 102-J (or any other switch 102-i) is a two-port rather than a three-port switch adapted to couple RF I/O-C port 116 via node 117-J to RF I/O port 118-J (or RF I/O port 120-J but not both), then N will be odd. Persons of skill in the art will understand how to do this based on the description herein.

Figure 6:
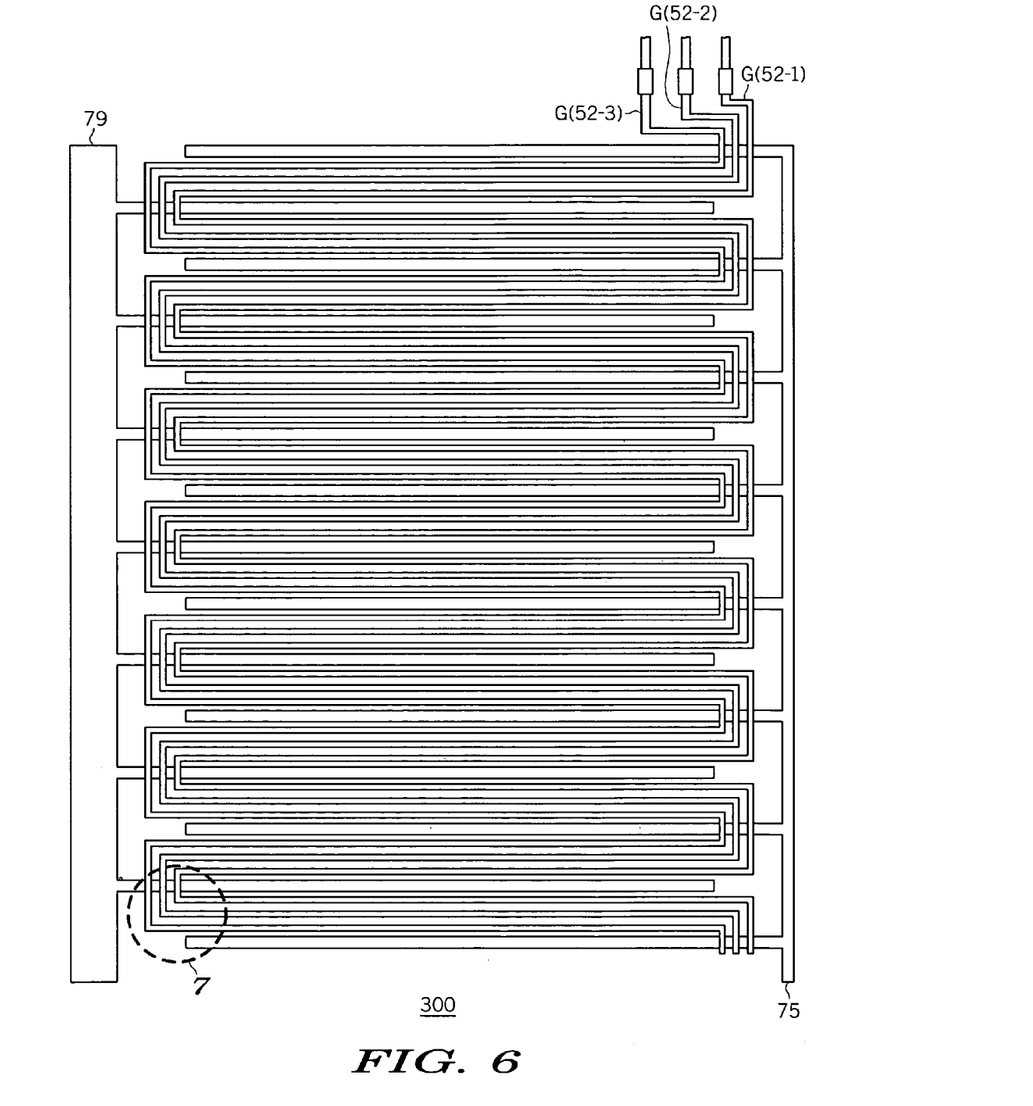
FIG. 6 is a simplified plan view of the FET of FIG. 2.
Figure 7:
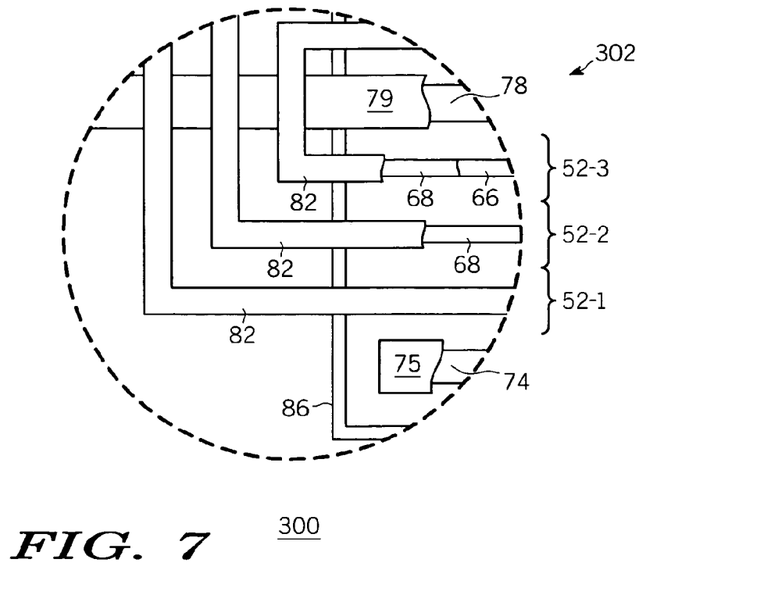
FIG. 7 is an enlarged portion of the plan view of FIG. 6, showing greater detail.

FIG. 6 shows simplified plan view 300 of FET 50 of FIG. 2. FIG. 7 shows enlarged portion 302 of plan view 300 of FIG. 6, presenting greater detail. Contact 74 to source region 72 (see FIG. 2) with overlying metal conductor 75; contact 78 to drain region 76 (see FIG. 2) with overlying metal conductor 79, and gate regions 68 with overlying metal conductors 82 are identified for three gate FET 50 comprising cascaded FET devices 52-1, 52-2, 52-3 shown in cross-section in FIG. 2. In the overall view of FET 50 in FIG. 6, gate leads G(52-1), G(52-2) and G(52-3), respectively, of cascaded devices 52-1, 52-2, 52-3 are indicated. Persons of skill in the art will understand based on the description herein that plan view 300 is presented merely by way of illustration and not limitation, since FET 50 may have any number of plan view arrangements well known in the art.

Figure 8:
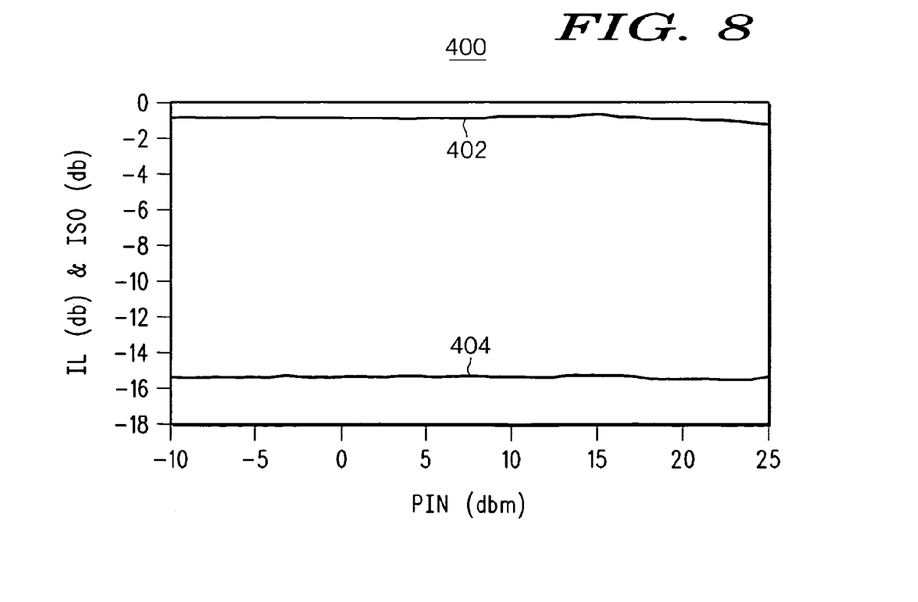
FIG. 8 is a plot of insertion loss versus RF input power for the RF switch of the present invention in the ON and OFF states.

FIG. 8 shows plot 400 of insertion loss (IL) versus RF input power (Pin) for the RF switch of the present invention in the ON state (trace 402) and the OFF state (trace 404). It will be apparent that the present invention has very low insertion loss in the ON-state and excellent isolation in the OFF state, that is substantially independent of the RF power level from −10 to +25 dbm. The present invention operates at frequencies of the order of 3.5 GHz and with switching voltages of about three volts and zero volts. Thus, the invented arrangement provides a device exhibiting excellent properties. Higher power levels with similar low insertion loss can be obtained by increasing the number of gates and/or the total device periphery.

Figure 9:
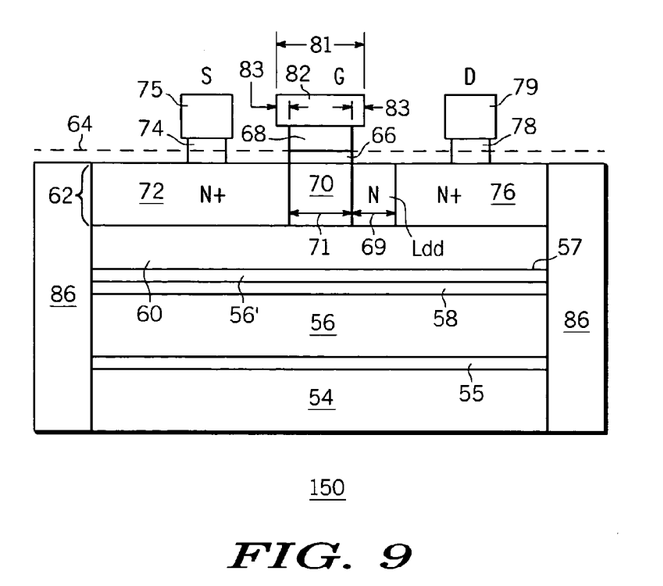
FIG. 9 is a simplified schematic cross-sectional view through a single gate, n-channel, enhancement mode FET formed using the same processing technology as the device of FIG. 2 and employed in combination with the device of FIG. 2 to form integrated circuits, according to the present invention.

FIG. 9 is a simplified schematic cross-sectional view of single gate, n-channel, enhancement mode FET 150 formed using the same processing technology as FET 50 of FIG. 2 and employed in combination with FET 50 of FIG. 2 to form complete integrated RF integrated circuit (IC) functions, according to the present invention. The same reference numbers are used in FIGS. 2 and 9 to identify like regions. FET 150 of FIG. 9 differs from FET 50 of FIG. 2 in that FET 150 has only single channel region 70, single portion 66 and gate region 68, and single Ldd region of length 69 separating channel region 70 from N+ drain region 76. Persons of skill in the art will understand based on the description herein that the dimensions of like numbered regions in FETs 50 and 150 will differ depending upon the desired properties of the individual FETs. The description in connection with FIG. 2 regarding the arrangement and composition of the various layers and regions of FET 50 is incorporated herein by reference and applies to FET 150.

Figure 10:
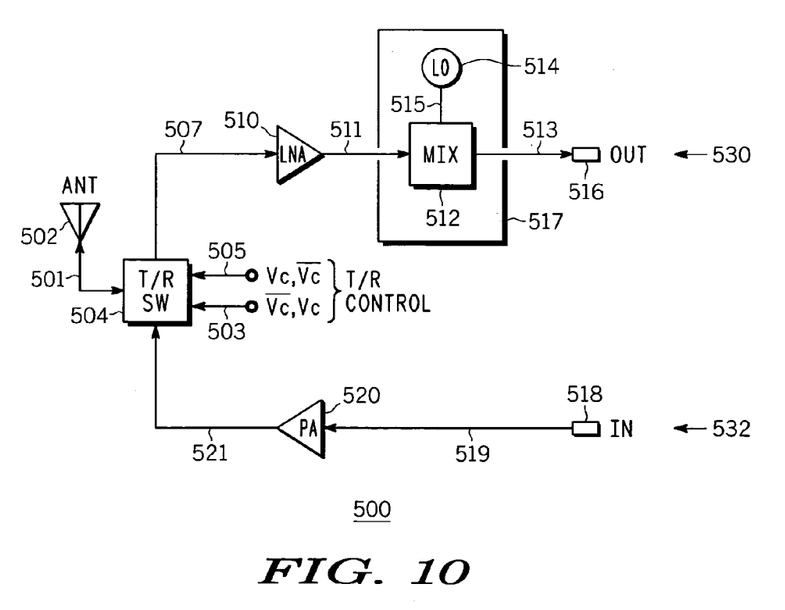
FIG. 10 is a simplified schematic block diagram of a fully integrated monolithic integrated circuit (IC) employing the devices of FIGS. 2 and 9, made using a common processing technology.

FIG. 10 is a simplified schematic block diagram of fully integrated monolithic IC transceiver 500 employing the devices of FIGS. 2 and 9 (and resistance and capacitance), made using the common processing technology described in connection with FIGS. 2 and 9 and formed on a common substrate. Antenna 502, which is ordinarily external to monolithic IC transceiver 500, is coupled to transmit/receive switch (T/R SW) 504 via lead or connection 501. T/R SW 504 is desirably of the type illustrated, for example, by switch 100 of FIG. 3 wherein RF I/O-C of switch 100 would be coupled to antenna 502 via lead 501, and either of RF I/O-1A port 118 or RF I/O-1B port 120 would be coupled to output lead 507 and the other coupled to input lead 521. T/R SW 504 has T/R control ports 503, 505 corresponding respectively to control ports 122, 124 of switch 100 for receiving, for example, control voltages Vc and Vc(bar).

With the appropriate polarity and magnitude of signals Vc and Vc(bar), e.g., see FIG. 4, on control ports 503, 505, transceiver 500 acts as a receiver and output lead 507 from T/R SW 504 feeds the signal received by antenna 502 to receiver side 530. Receiver side 530 comprises low noise amplifier (LNA) 510 whose output 511 is conveniently coupled to frequency shifting apparatus 517. By way of illustration and not intended to be limiting, frequency shifting apparatus 517 usefully comprises mixer (MIX) 512 which receives the amplified antenna signal from LNA 510 and combines it with a local oscillator signal received on lead 515 from local oscillator (LO) 514. The output of frequency shifting apparatus 517 (e.g., from mixer 512) is fed via lead 513 to output (OUT) port 516, where it is available to other signal processing elements (not shown) well known in the art. While frequency shifting apparatus 517 is illustrated as comprising mixer 512 and local oscillator 514, persons of skill in the art will understand that other functions can be incorporated within mixer frequency shifting apparatus 517 and that the signal present on output lead 513 and output port 516 is not limited merely to an intermediate frequency (IF) signal, but may be dowconverted and detected to provide, for example, a base-band or other communication signal in analog or digital form. Accordingly, illustration of mixer 512 and LO 514 are merely by way of example and not intended to be limiting and frequency shifting apparatus 517 is intended to include any means for converting the incoming RF signal to voice, data or other un-modulated information carrying signal that can be directly processed by further downstream system elements (not shown).

With the opposite polarity of signals Vc and Vc(bar) on control ports 503, 505, transceiver 500 acts as a transmitter, and transceiver side 532 is active. A signal present on RF input (RF IN) port 518 is coupled via lead 519 to power amplifier (PA) 520 and such amplified RF signal sent via lead 521 through T/R SW 504 and over lead or connection 501 to antenna 502, from whence it is transmitted. The low distortion and high power handling capabilities described in connection with switch 100 of FIG. 3, facilitate the performance of transceiver 500 embodying T/R SW 504 of the type illustrated in FIG. 3. While T/R SW 504 desirably employs devices such as FETs 50 illustrated in FIG. 2, the other elements in transceiver 500 (e.g., in LNA 510, PA 520, mixer 512 and LO 514) conveniently employ FETs 150 of the type illustrated in FIG. 9. Resistances and capacitances are likewise formed as described in connection with FIGS. 2 and 9.

Figure 11:
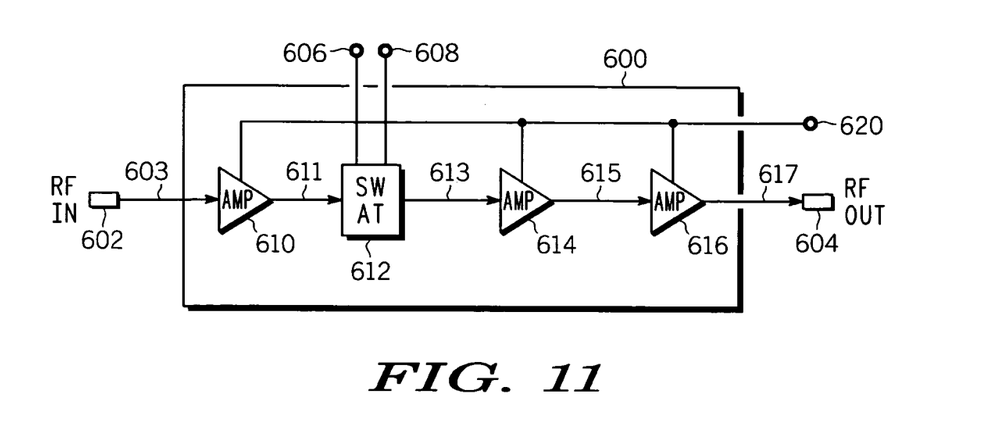
FIG. 11 is a simplified schematic diagram of a switched gain amplifier integrated circuit (IC) according to the present invention utilizing the devices of FIGS. 2 and 9, made using a common processing technology.

FIG. 11 is a simplified schematic diagram of switched gain RF amplifier 600 according to the present invention utilizing devices 50, 150 of the types shown in FIGS. 2 and 9, made using a common processing technology on a common substrate. Switched gain RF amplifier 600 allows the signal introduced at RF IN port 602 and extracted at RF OUT port 604 to be varied in amplitude according to the presence or absence of the appropriate control signal(s) on one or both of control ports 606, 608. Switched gain RF amplifier 600 comprises input RF amplifier (AMP) 610 that receives an input signal from RF IN port 602 over lead 603. The amplified input signal is transferred over output lead 611 from input AMP 610 to RF switched attenuator (RF SW AT) 612 that operates under the control of signals provided at one or both of control ports 606, 608. While RF SW AT 612 is shown as having two control ports 606, 608, this is not essential and RF SW AT 612 may operate under the direction of one or more control signals (e.g., $V_{Attn}$; Vc, Vc(bar), etc.) provided on one or more control ports 606, 608, etc. Application of the appropriate control voltage to control ports 606, 608 causes RF SW AT 612 to turn OFF which bypasses the attenuator components so that the signal received via lead 611 substantially passes through RF SW AT 612. Under these circumstances, switched gain RF amplifier 600 is said to be in the high gain mode, since RF SW AT 612 is not attenuating. When the control voltages on ports 606, 608 are such as to cause RF SW AT 612 to be ON, then switched gain RF amplifier 600 is said to be in the low gain mode, since the attenuator circuit components of RF SW AT 612 are not bypassed and are now in the signal path. In either case, the signal emerging from RF SW AT 612 is desirably passed via lead 613 to second amplifier (AMP) 614 and thence via lead 615 to optional third amplifier (AMP) 616 and thence via lead 617 to RF OUT port 604. When AMP 616 is omitted, then the RF signal is passed via lead 615, 617 to RF OUT port 604. Optional control terminal 620 coupled to AMPs 616, 614, 610 allows these AMPs to be turned ON or OFF. In the preferred embodiment, this is used to power-down switched gain RF amplifier 600 when it is not needed, thereby reducing overall power consumption. While switched gain RF amplifier 600 is shown as having three amplifying stages, that is, AMPs 610, 614, 616 this is not essential and fewer or more stages may be used. It is desirable that there be a pre-amp stage (e.g., AMP 610) prior to RF SW AT 612 and at least one power amp stage (e.g., AMP 614 and/or 616) following RF SW AT 612. In the preferred embodiment, three stages, i.e., AMPs 610, 614, 616 are used.

Figure 12:
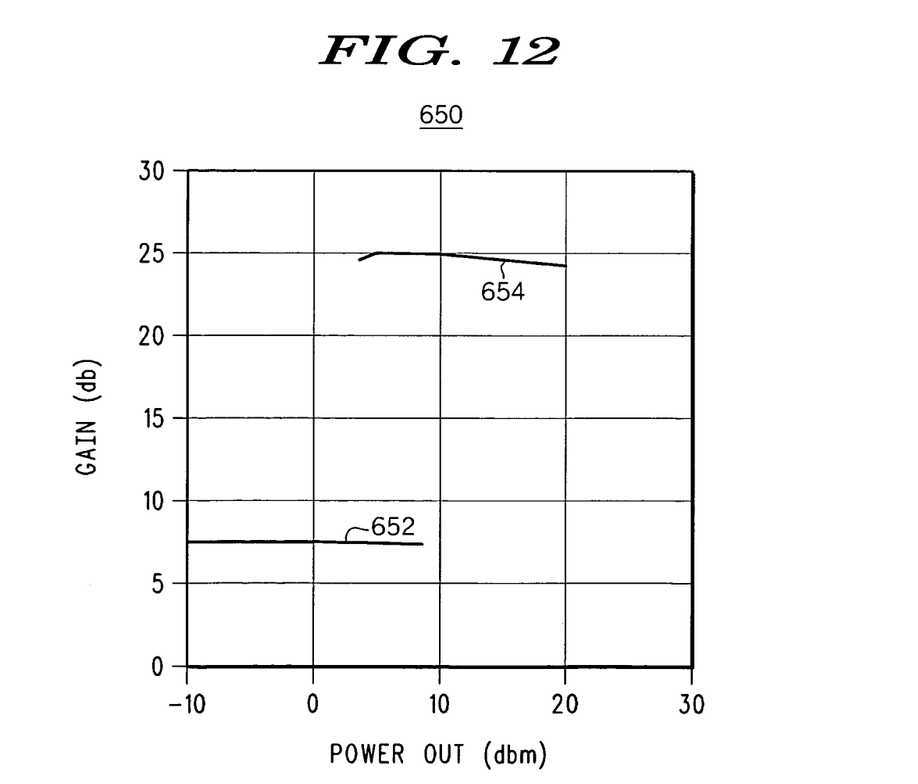
FIG. 12 shows the transfer gain performance of the switched gain amplifier of FIG. 11 as a function of power output for two attenuation states.

FIG. 12 shows graph 650 of the transfer gain in decibels of switched gain amplifier 600 of FIG. 11 at 3.5 GHz as a function of power output in dbm for two attenuation states, where trace 652 shows the results with RF SW AT 612 ON (attenuating) and trace 654 shows the results with RF SW AT 612 OFF (not attenuating). It will be noted that the gain through switched gain amplifier 600 changes from approximately 7.5 db to 25 db by turning RF SW AT ON/OFF and that the difference is substantially constant over a wide range of output powers. The overall gain in either the ON or OFF state is determined by the aggregate gain of AMPs 610, 614, 616 and may be adjusted by the designer to suit the particular application. It is important that each stage be impedance matched at the operating frequency to the preceding and succeeding stages to avoid reflected signal loss. Switched gain amplifier 600 of the present invention had a noise figure of 5 db with the attenuator OFF and 19 db with the attenuator ON, compared to prior art switched gain amplifiers for the same frequency range (e.g., of the order of 3.5 GHz) that have noise figures of 10 db (OFF) and 28 db (ON), respectively. Thus, the present invention provides a significant improvement over the prior art, which has generally employed PIN diodes instead of the arrangement of the present invention.

Figure 13:
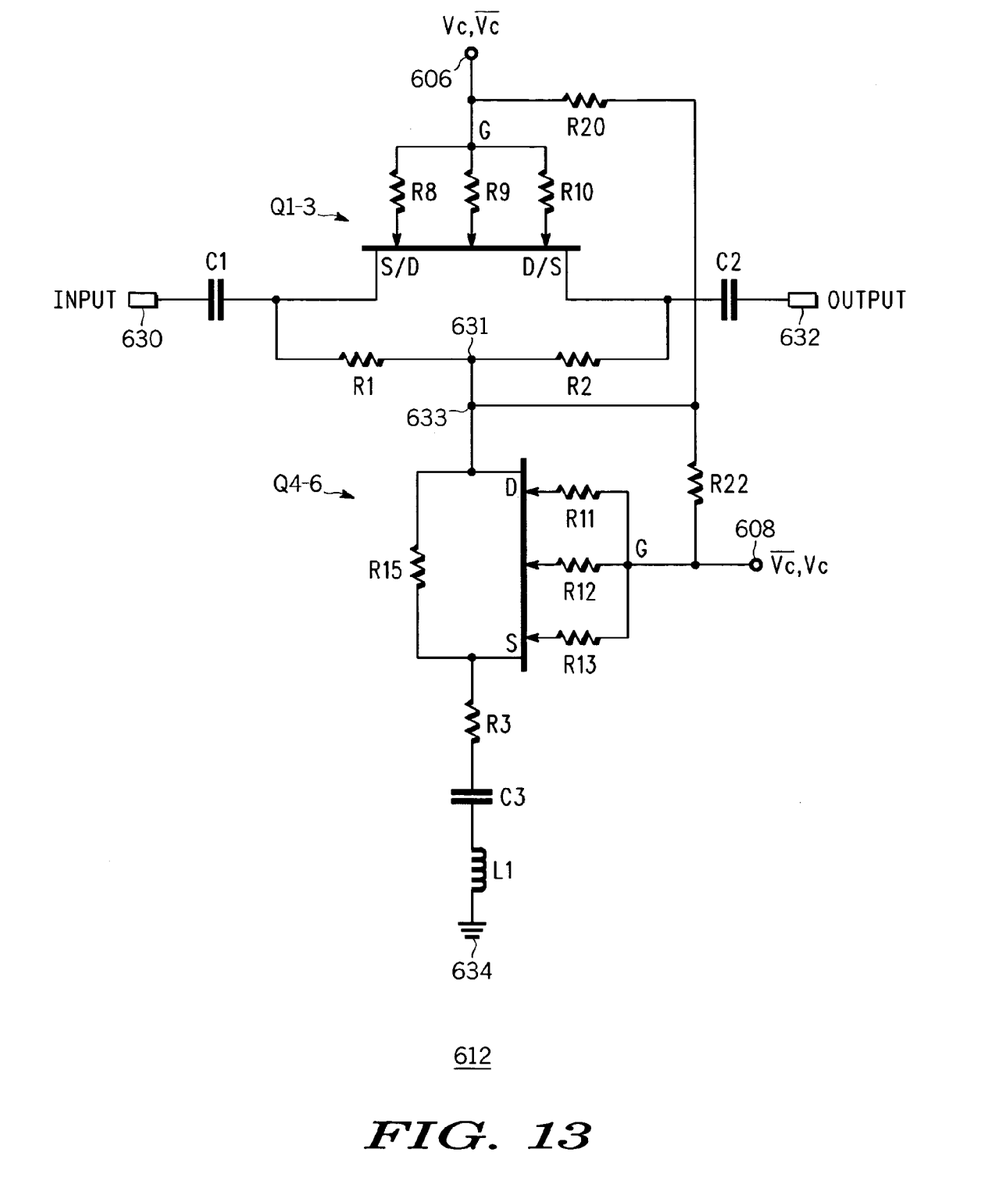
FIG. 13 is a simplified schematic diagram of a switched attenuator employed in the switched gain amplifier of FIG. 11, according to a first embodiment of the present invention.

FIG. 13 is a simplified schematic diagram of switched attenuator (RF SW AT) 612 such as employed in switched gain amplifier 600 of FIG. 11, according to a first embodiment of the present invention. Signal input-output (I/O) ports 630, 632 in FIG. 13 connect to, respectively, leads 611, 613 in FIG. 11. DC blocking capacitances or capacitances C1, C2, C3 are provided to DC isolate the internal elements of RF SW AT 612 from signal I/O ports 630, 632 and reference potential connection 634. Multi-gate FETs Q1-3 and Q4-6 are desirably of the type illustrated by FET 50 of FIG. 2, that is, n-channel, enhancement mode, multi-gate FETs. Multi-gate FET Q1-3 with gate resistances R8-R10 and multi-gate FET Q4-6 with gate resistances R11-R13 are also analogous to FET 112 with gate resistances Rg and FET 114 with gate resistances Rg', respectively, of switch 100 of FIG. 3, but have different source/drain connections. FET Q1-3 has its source and drain coupled between ports 630, 632 via DC blocking capacitances C1, C2. For FET Q1-3, the designations of "source" and "drain" are arbitrary since the device operates symmetrically. The source and drain of FET Q1-3 are coupled by series connected resistors or resistances R1, R2. The mid-point or common connection node 631 of resistances R1, R2, is coupled to node 633, which serves a function similar to node 133 of FIG. 3 as far as biasing is concerned. FET Q46 desirably has its drain coupled to node 631, 633 and its source coupled to reference potential connection 634, preferably via the series combination of resistance R3, DC blocking capacitance C3 and inductor L1. The order of series connected elements R3, C3 and L1 is not important. Inductor L1 is desirably but not essentially provided to shape the frequency response of RF SW AT 612. Resistance R15, analogous in function to resistance Re, Re' of FIG. 3, is desirably coupled between the source and drain of Q4-6. The operation of RF SW AT 612 of FIG. 13 is controlled by voltages Vc, Vc(bar) applied in opposite phase at control ports 606, 608 (e.g., see FIG. 4). Resistance R20 coupled between control port 606 and node 631, 633 is analogous in function to resistance Rb of FIG. 3 and resistance R22 coupled between control port 608 and node 631, 633 is analogous in function to resistance Rb' of FIG. 3 for bias purposes. Resistances R20, R22 provide the proper bias on node 631, 633 so that FETs Q1-3 and Q4-6 can be operated from a single voltage supply Vc, Vc(Bar) of, for example, +3 volts and 0 volts (and vice versa).

Q1-3 acts as a pass device and Q4-6 acts as a blocking device for the T-type attenuator formed by resistances R1, R2 (in parallel with Q1-3) and resistance R3 (in series with Q4-6). When control port 606 of FIG. 13 receives Vc (e.g., +3 volts) and control port 608 receives Vc(bar) (e.g., 0 volts), then multi-gate FET Q1-3 is ON, thereby by-passing resistances R1, R2 so that the input RF signal can pass substantially unimpeded from signal I/O port 630 functioning as an input to signal I/O port 632 functioning as an output, and multi-gate FET Q4-6 is OFF, thereby interrupting the RF path through series coupled resistance R3, capacitance C1 and inductance L1. In this state, RF SW AT 612 is OFF, that is, there is no significant attenuation of the RF signal being passed through switched gain amplifier 600 (e.g., see trace 654 of FIG. 12). When the opposite control signal condition occurs, that is when control port 606 receives Vc(bar) (e.g., 0 volts) and control port 608 receives Vc (e.g., +3 volts), then multi-gate FET Q1-3 is OFF thereby forcing a substantial portion of the RF signal passing between I/O ports 630, 632 to go through resistances R1, R2, and multi-gate FET Q4-6 is ON thereby allowing a portion of the RF signal to pass through R3 to reference potential connection 634. Under this condition, resistances R1, R2, R3 of RF SW AT 612 form a "T" type attenuator so that switched attenuator 612 is ON resulting in significant attenuation of the RF signal through switched gain RF amplifier 600 relative to the OFF state, as shown by trace 652 of FIG. 12.

Figure 14:
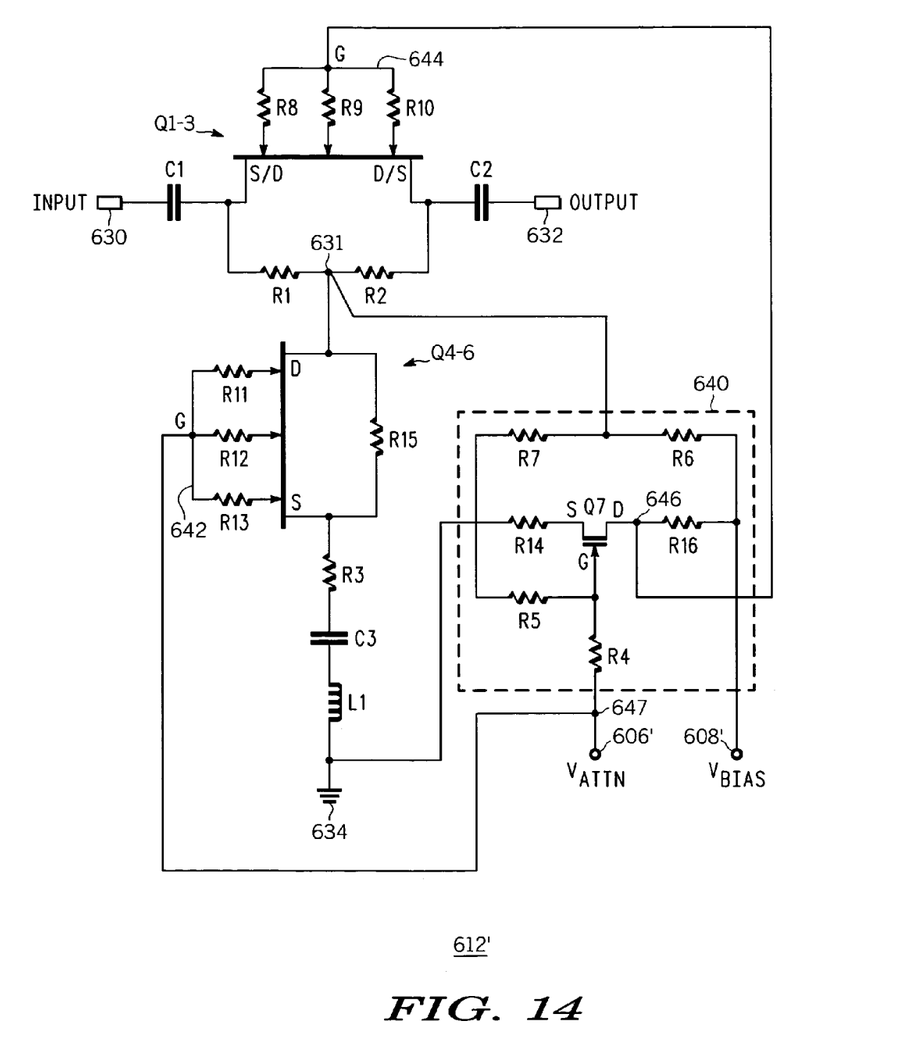
FIG. 14 is a simplified schematic diagram of a switched attenuator employed in the switched gain amplifier of FIG. 11, according to a second embodiment of the present invention.

FIG. 14 is a simplified schematic diagram of RF SW AT 612' alternatively employed in switched gain amplifier 600 of FIG. 11, according to a second embodiment of the present invention. Like reference numbers have been used to identify similar elements in RF SW ATs 612 and 612'. In RF SW AT 612' (like RF SW AT 612) FET Q1-3 has its source and drain coupled between ports 630, 632 via capacitances C1, C2 and the designations of "source" and "drain" are arbitrary since the device operates symmetrically. The source and drain of FET Q1-3 are coupled by series connected resistors or resistances R1, R2, whose mid-point or common connection node 631 is coupled to the drain of FET Q4-6. FET Q4-6 is coupled between node 631 and reference potential connection 634 via the series combination of resistance R3, capacitance C3 and inductor L1, which may be arranged in any order. Inductor L1 is desirably but not essentially provided to shape the frequency response of RF SW AT 612'. Resistance R15, analogous in function to resistance Re, Re' of FIG. 3, is desirably coupled between the source and drain of Q4-6. RF SW AT 612 of FIG. 13 and RF SW AT 612' of FIG. 14 differ in the manner of biasing and providing a control voltage to operate switched attenuator 612'. Resistances R20, R22 are omitted in RF SW AT 612'. Rather, bias and control circuit 640 is provided using a substantially fixed bias voltage $V_{Bias}$ supplied via bias voltage input or port 608' and time varying attenuator control voltage $V_{Attn}$ supplied to control node 647 via control port 606'. Bias and control circuit 640 comprises resistances R4, R5, R6, R7, R14 and R16 and, for example, single-gate FET Q7 (e.g., analogous to FET 150 of FIG. 9). Gates 642 of multi-gate FET Q4-6 are coupled to control node 647 to receive $V_{Attn}$ from control port 606'. Gates 644 of multi-gate FET Q1-3 are coupled to control node 646 between the drain of FET Q7 and resistance R16. $V_{Attn}$ is the time varying external control voltage applied at control port 606' that directly switches multi-gate FET Q4-6 and indirectly switches multi-gate FET Q1-3. FET Q7 along with resistances R4, R5, and R14, R16 form an inverter that creates an inverted control voltage on control node 646 in response to $V_{Attn}$ signal on control port 606' and thereby switch multi-gate FET Q1-3 into the opposite state from multi-gate FET Q4-6. The resistive divider formed by R6, R7 coupled to bias voltage $V_{Bias}$ on bias voltage input or port 608', generates the proper floating bias voltage for multi-gate FETs Q1-3 and Q4-6 to perform the correct switching even under high RF signal conditions. One end of R6 is coupled to bias voltage port 608', the other end to the joint connection of R6, R7 and the other end of R7 is coupled to reference potential connection 634. The joint connection of R6, R7 is coupled to node 631.

When $V_{Attn}$ applied to control port 606' is in its LOW state (e.g., 0 volts), then enhancement mode multi-gate FET Q4-6 and FET Q7 will be switched OFF. When FET Q7 is OFF, node 646 goes HIGH, that is, to about $V_{Bias}$ less some leakage drop, and enhancement mode multi-gate FET Q1-3 is switched ON. This provides a substantially direct RF signal path between I/O ports 630, 632, bypassing or interrupting the T-type attenuator formed by resistances R1, R2, R3. In this circumstance, switched attenuator 612' is said to be OFF (not attenuating). When $V_{Attn}$ is in its HIGH state (e.g., +3 volts) then multi-gate FET Q4-6 will be switched ON. FET Q7 will also be switched ON, pulling node 646

LOW so that multi-gate FET Q1-3 switches OFF. This places the T-type attenuator formed by resistances R1, R2, R3 directly in the RF path between I/O ports 630, 632. In this circumstance, switched attenuator 612' is said to be ON (attenuating). Resistance R16 is desirably much greater than R14. The ratio ($V_{Bias}/V_{Attn}$) is usefully between 1.0 to 1.5 and more preferably about 1.0 to 1.2, that is, $V_{Bias}$ is at least equal to $V_{Attn}$ or somewhat larger. Persons of skill in the art will understand that the magnitude of $V_{Bias}$ and $V_{Attn}$ will depend upon the particular device technology being used. In the present case, an operating voltage of 0 and +3 volts was suitable.

While multi-gate FETs Q1-3 and Q4-6 are illustrated here as having three gates each, this is merely for convenience of explanation and not intended to be limiting. Any number of gates may be provided in these FETs. Further, while particular arrangements for biasing FETs Q1-3 and Q4-6 are illustrated, this is intended by way of example and not intended to be limiting. Those of skill in the art will understand that a wide variety of biasing means and control signals for activating RF SW ATs 612, 612' may be used without departing from the scope of the present invention. Further, while RF SW AT 612 and 612' are shown in FIGS. 13, 14 as having I/O port 630 functioning as an input and I/O port 632 functioning as an output, persons of skill in the art will understand based on the description herein that RF SW AT 612 and 612' are symmetrical and that ports 630, 632 can be interchanged, that is, either functioning as an RF input and the other as an RF output. In addition, because of the symmetrical nature of the operation of FET Q1-3, the identification of particular terminals thereof as source terminals or drain terminals is not intended to be limiting and these designations can be interchanged.

In a first exemplary embodiment, there is provided a switched gain RF amplifier having an RF IN port, an RF OUT port and two or more control ports, wherein the switched gain RF amplifier comprises: a first RF amplifier having a first input coupled to the RF IN port and having a first output; a second RF amplifier having a second input and having a second output coupled to the RF OUT port; an RF switched attenuator (RF SW AT) having an RF signal input port coupled to the first output and an RF signal output port coupled to the second input, wherein the RF SW AT comprises; first and second n-channel enhancement mode FETs, each having source, drain and multiple parallel-coupled gate regions serially arranged and spaced apart between the source and drain; wherein the source of the first FET is coupled to the RF signal input port of the RF SW AT and the drain of the first FET is coupled to the RF signal output port of the RF SW AT and the multiple parallel-coupled gate regions of the first FET are coupled to a first of the two or more control ports; and further comprising first and second resistances commonly connected at a first common node and serially coupled between the source and drain of the first FET; a reference potential connection; a third resistance having a first terminal coupled to the reference potential connection and having a second terminal; and wherein the source of the second FET is coupled to the second terminal of the third resistance and the drain of the second FET is coupled to the first common node and the multiple parallel-coupled gate regions of the second FET are coupled to a second of the two or more control ports. With the foregoing switched gain RF amplifier, it is further desirable that each spaced-apart gate region of each FET is separated from its neighbor by first and second lightly doped n-type regions, and there is provided a more heavily doped n-region located between the spaced-apart gate regions separating the first and second lightly doped n-type regions. The foregoing switched gain RF amplifier further desirably comprises a first bias resistance coupled between the first common node and the first of the two or more control ports and a second bias resistance coupled between the first common node and the second of the two or more control ports. Additionally, it is desirable that each of the multiple parallel-coupled gate regions of the first FET is coupled to the first of the two or more control ports by a gate resistance; and each of the multiple parallel-coupled gate regions of the second FET is coupled to the second of the two or more control ports by a gate resistance. Still further it is desirable that the first and second bias resistances are of substantially similar magnitude. Yet additionally, it is desirable that the switched gain RF amplifier further comprise first, second and third capacitances, wherein the source of the first FET is coupled to the RF signal input port of the RF SW AT by the first capacitance, and wherein the drain of the first FET is coupled to the RF signal output port of the RF SW AT by the second capacitance, and wherein the source of the second FET is coupled to the reference potential connection by a series combination of the third resistance and the third capacitance. In a further implementation it is desirable that the switched gain RF amplifier comprise an inductance coupled in series with the third capacitance and third resistance. In a still further implementation it is desirable that the first and second FETS and the first and second amplifiers are formed substantially simultaneously on a common substrate. In a still yet additional implementation it is desirable that the switched gain RF amplifier further comprise a third of the two or more control ports, coupled to the first and second amplifiers, and configured to turn the first and second amplifiers ON and OFF in response to a signal received on the third of the two or more control ports.

In a second exemplary embodiment there is provided a switched attenuator, comprising: a first control input; first and second control nodes; an inverter having an input coupled to first control input and to the second control node and an output coupled to the first control node; first and second capacitances, wherein the first capacitance has first and second terminals and the second capacitance has third and fourth terminals; first and second serially coupled resistances with a common connection node therebetween, wherein a combination of the first and second serially coupled resistances has fifth and sixth terminals; serially coupled third capacitance and third resistance, wherein a combination of the serially coupled third capacitance and third resistance have seventh and eighth terminals; first and second RF signal I/O ports, coupled respectively to the first and third terminals; a reference potential connection coupled to the eighth terminal; a first enhancement mode multi-gate FET device having source, drain and gate terminals, wherein its source is coupled to the second and fifth terminals, its drain is coupled to the fourth and sixth terminals and its gates are coupled to the first control node; and a second enhancement mode multi-gate FET device having source, drain and gate terminals, wherein its drain terminal is coupled to the common connection node and its source terminal is coupled to the seventh terminal, and its gates are coupled to the second control node. There is desirably further provided a first inductance serially coupled with the third resistance and the third capacitance between the seventh and eighth terminals. It is further desirable that the RF switched attenuator further comprise fourth resistances coupled between each gate terminal of the first enhancement mode multi-gate FET device and the first control node, and fifth resistances coupled between each gate terminal of the second enhancement mode multi-gate FET device and the second control node. In addition, it is desirable that the RF switched attenuator further comprise a bias voltage input port configured to provide a voltage of magnitude $V_{Bias}$ to the output of the inverter, wherein the first control input is configured to provide a control voltage of magnitude $V_{Attn}$ to the input of the inverter, wherein a ratio $V_{Bias}/V_{Attn}$ is desirably in a range of about 1.0 to 1.5, and more preferably in a range of about 1.0 to 1.2.

In a third exemplary embodiment, there is provided a monolithic integrated circuit transceiver having an antenna RF I/O port configured to send an RF signal to or receive an RF signal from an antenna, an another frequency output port and an RF signal input port, wherein the transceiver comprises: a transmit-receive switch (T/R SW) having the antenna RF I/O port and first and second further ports, configured to couple the antenna RF I/O port to either the first or second further ports in response to first or second signals received at one or more control ports; a first amplifier having a first amplifier input port coupled to the first further port of the T/R SW, and having a first amplifier output port, wherein the first amplifier is configured to receive an RF signal from the antenna RF I/O port of the T/R SW and deliver an amplified RF signal thereof to the first amplifier output port; a frequency shifting apparatus having a first shifter input port coupled to the first amplifier output port and configured to receive the amplified RF signal from the first amplifier and provide a signal at a different frequency to the another frequency output port of the transceiver; a second amplifier having a second amplifier input coupled to the RF signal input port of the transceiver and having a second amplifier output coupled to the second further port of the T/R SW and configured to receive a input signal from the RF signal input port of the transceiver and provide an amplified version thereof to the T/R SW; and wherein the T/R SW, is configured so that in response to a first control signal received from the one or more control ports, it passes the signal received from the antenna RF I/O port to the first amplifier, and in response to a second control signal received from the one or more control ports, it passes the signal received from the second amplifier to the antenna RF I/O port; and wherein the T/R SW comprises: first and second n-channel enhancement mode FETs, each having source, drain and multiple parallel-coupled gate regions serially arranged and spaced apart between the source and drain; wherein the sources of the first and second FETs are coupled to the antenna RF I/O port and the drain of the first FET is coupled to the first further port of the T/R SW and the drain of the second FET is coupled to the second further port of the T/R SW and the multiple parallel-coupled gate regions of the first FET are coupled to a first of the one or more control ports and the multiple parallel-coupled gate regions of the second FET are coupled to a second of the one or more control ports. It is desirable that the monolithic integrated circuit transceiver further comprise first, second and third DC blocking capacitances, wherein the first capacitance is coupled between the antenna RF I/O port and the sources of the first and second FETs, wherein the second capacitance is coupled between the drain of the first FET and the first further port of the T/R SW, and wherein the second capacitance is coupled between the drain of the second FET and the second further port of the T/R SW. It is additionally desirable that the T/R SW of monolithic integrated circuit transceiver further comprises, first and second bias resistances Rb, Rb', each having first and second terminals, wherein the first terminal of the first bias resistances Rb is coupled to the source of the first FET and the second terminal of the first bias resistance Rb is coupled to the first of the one or more control ports and the first terminal of the second bias resistances Rb' is coupled to the source of the second FET and the second terminal of the second bias resistance Rb/ is coupled to the second of the one or more control ports. It is yet further desirable that the T/R SW of the monolithic integrated circuit transceiver further comprises a first further resistance Re coupled between the source and drain of the first FET, and a second further resistance Re' coupled between the source and drain of the second FET.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A switched gain RF amplifier having an RF IN port, an RF OUT port and two or more control ports, comprising:
    a first RF amplifier having a first input coupled to the RF IN port and having a first output;
    a second RF amplifier having a second input and having a second output coupled to the RF OUT port;
    an RF switched attenuator (RF SW AT) having an RF signal input port coupled to the first output and an RF signal output port coupled to the second input, wherein the RF SW AT comprises;
    first and second n-channel enhancement mode FETs, each having source, drain and multiple parallel-coupled gate regions serially arranged and spaced apart between the source and drain;
    wherein the source of the first FET is coupled to the RF signal input port of the RF SW AT and the drain of the first FET is coupled to the RF signal output port of the RF SW AT and the multiple parallel-coupled gate regions of the first FET are coupled to a first of the two or more control ports;
    first and second resistances commonly connected at a first common node and serially coupled between the source and drain of the first FET;
    a reference potential connection;
    a third resistance having a first terminal coupled to the reference potential connection and having a second terminal;
    wherein the source of the second FET is coupled to the second terminal of the third resistance and the drain of the second FET is coupled to the first common node and the multiple parallel-coupled gate regions of the second FET are coupled to a second of the two or more control ports.

2. The switched gain RF amplifier of claim 1, wherein:
    each spaced-apart gate region of each FET is separated from its neighbor by first and second lightly doped n-type regions; and
    there is provided a more heavily doped n-type region located between the spaced-apart gate regions separating the first and second lightly doped n-type regions.

3. The switched gain RF amplifier of claim 1, further comprising:

a first bias resistance coupled between the first common node and the first of the two or more control ports; and
a second bias resistance coupled between the first common node and the second of the two or more control ports.

4. The switched gain RF amplifier of claim 3, wherein:
each of the multiple parallel-coupled gate regions of the first FET is coupled to the first of the two or more control ports by a gate resistance; and
each of the multiple parallel-coupled gate regions of the second FET is coupled to the second of the two or more control ports by a gate resistance.

5. The switched gain RF amplifier of claim 3, wherein the first and second bias resistances are of substantially similar.

6. The switched gain RF amplifier of claim 3, further comprising:
first, second and third capacitances;
wherein the source of the first FET is coupled to the RF signal input port of the RF SW AT by the first capacitance; and
wherein the drain of the first FET is coupled to the RF signal output port of the RF SW AT by the second capacitance; and
wherein the source of the second FET is coupled to the reference potential connection by a series combination of the third resistance and the third capacitance.

7. The switched gain RF amplifier of claim 6, further comprising an inductance coupled in series with the third capacitance and third resistance.

8. The switched gain RF amplifier of claim 1 wherein the first and second FETS and the first and second amplifiers are formed substantially simultaneously on a common substrate.

9. The switched gain RF amplifier of claim 1 further comprising a third of the two or more control ports, coupled to the first and second amplifiers, and configured to turn the first and second amplifiers ON and OFF in response to a signal received on the third of the two or more control ports.

10. An RF switched attenuator, comprising:
a first control input;
first and second control nodes;
an inverter having an input coupled to first control input and to the second control node and an output coupled to the first control node;
first and second capacitances, wherein the first capacitance has first and second terminals and the second capacitance has third and fourth terminals;
first and second serially coupled resistances with a common connection node therebetween, wherein a combination of the first and second serially coupled resistances has fifth and sixth terminals;
serially coupled third capacitance and third resistance, wherein a combination of the serially coupled third capacitance and third resistance have seventh and eighth terminals;
first and second RF signal I/O ports, coupled respectively to the first and third terminals;
a reference potential connection coupled to the eighth terminal;
a first enhancement mode multi-gate FET device having source, drain and gate terminals, wherein its source is coupled to the second and fifth terminals, its drain is coupled to the fourth and sixth terminals and its gates are coupled to the first control node; and
a second enhancement mode multi-gate FET device having source, drain and gate terminals, wherein its drain terminal is coupled to the common connection node and its source terminal is coupled to the seventh terminal, and its gates are coupled to the second control node.

11. The RF switched attenuator of claim 10, further comprising a first inductance serially coupled with the third resistance and the third capacitance between the seventh and eighth terminals.

12. The RF switched attenuator of claim 10, further comprising:
fourth resistances coupled between each gate terminal of the first enhancement mode multi-gate FET device and the first control node; and
fifth resistances coupled between each gate terminal of the second enhancement mode multi-gate FET device and the second control node.

13. The RF switched attenuator of claim 10, further comprising:
a bias voltage input port configured to provide a voltage of magnitude $V_{Bias}$ to the output of the inverter;
wherein the first control input is configured to provide a control voltage of magnitude $V_{Attn}$ to the input of the inverter;
wherein a ratio $V_{Bias}/V_{Attn}$ is in a range of about 1.0 to 1.5.

14. The RF switched attenuator of claim 13, wherein the ratio $V_{Bias}/V_{Attn}$ is in a range of about 1.0 to 1.2.

15. A monolithic integrated circuit transceiver having an antenna RF I/O port configured to send an RF signal to or receive an RF signal from an antenna, an another frequency output port and an RF signal input port, wherein the transceiver comprises:
a transmit-receive switch (T/R SW) having the antenna RF I/O port and first and second further ports, configured to couple the antenna RF I/O port to either the first or second further ports in response to first or second signals received at one or more control ports;
a first amplifier having a first amplifier input port coupled to the first further port of the T/R SW, and having a first amplifier output port, wherein the first amplifier is configured to receive an RF signal from the antenna RF I/O port of the T/R SW and deliver an amplified RF signal thereof to the first amplifier output port;
a frequency shifting apparatus having a first shifter input port coupled to the first amplifier output port and configured to receive the amplified RF signal from the first amplifier and provide a signal at a different frequency to the another frequency output port of the transceiver;
a second amplifier having a second amplifier input coupled to the RF signal input port of the transceiver and having a second amplifier output coupled to the second further port of the T/R SW and configured to receive a input signal from the RF signal input port of the transceiver and provide an amplified version thereof to the T/R SW; and
wherein the T/R SW, is configured so that in response to a first control signal received from the one or more control ports, it passes the signal received from the antenna RF I/O port to the first amplifier, and in response to a second control signal received from the one or more control ports, it passes the signal received from the second amplifier to the antenna RF I/O port;
wherein the T/R SW comprises:
first and second n-channel enhancement mode FETs, each having source, drain and multiple parallel-coupled gate regions serially arranged and spaced apart between the source and drain;

wherein the sources of the first and second FETs are coupled to the antenna RF I/O port and the drain of the first FET is coupled to the first further port of the T/R SW and the drain of the second FET is coupled to the second further port of the T/R SW and the multiple parallel-coupled gate regions of the first FET are coupled to a first of the one or more control ports and the multiple parallel-coupled gate regions of the second FET are coupled to a second of the one or more control ports.

16. The monolithic integrated circuit transceiver of claim 15, wherein the T/R SW further comprises:

first, second and third DC blocking capacitances;

wherein the first capacitance is coupled between the antenna RF I/O port and the sources of the first and second FETs;

wherein the second capacitance is coupled between the drain of the first FET and the first further port of the T/R SW; and wherein the second capacitance is coupled between the drain of the second FET and the second further port of the T/R SW.

17. The monolithic integrated circuit transceiver of claim 16, wherein the T/R SW further comprises:

first and second bias resistances Rb, Rb', each having first and second terminals, wherein the first terminal of the first bias resistances Rb is coupled to the source of the first FET and the second terminal of the first bias resistance Rb is coupled to the first of the one or more control ports and the first terminal of the second bias resistances Rb' is coupled to the source of the second FET and the second terminal of the second bias resistance Rb/is coupled to the second of the one or more control ports.

18. The monolithic integrated circuit transceiver of claim 16, wherein the T/R SW further comprises:

a first further resistance Re coupled between the source and drain of the first FET; and a second further resistance Re' coupled between the source and drain of the second FET.

* * * * *